United States Patent
Liu

(10) Patent No.: US 12,402,361 B2
(45) Date of Patent: Aug. 26, 2025

(54) SEMICONDUCTOR STRUCTURE AND METHOD FOR FORMING THE SAME

(71) Applicant: Winbond Electronics Corp., Taichung (TW)

(72) Inventor: Chung-Hsien Liu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 427 days.

(21) Appl. No.: 18/149,868

(22) Filed: Jan. 4, 2023

(65) Prior Publication Data

US 2024/0222525 A1    Jul. 4, 2024

(51) Int. Cl.
  *H10D 30/68*    (2025.01)
  *H01L 21/762*   (2006.01)
  *H10D 30/01*    (2025.01)

(52) U.S. Cl.
  CPC ....... *H10D 30/68* (2025.01); *H01L 21/76224* (2013.01); *H10D 30/0411* (2025.01)

(58) Field of Classification Search
  CPC ................ H10D 30/68; H10D 30/0411; H01L 21/76224
  See application file for complete search history.

(56) References Cited

U.S. PATENT DOCUMENTS

| | | | |
|---|---|---|---|
| 7,384,843 B2 | 6/2008 | Kim et al. | |
| 7,560,340 B2 | 7/2009 | Cho et al. | |
| 7,682,901 B2 | 3/2010 | Kim | |
| 8,138,077 B2 | 3/2012 | Cho et al. | |
| 2006/0128099 A1 | 6/2006 | Kim et al. | |
| 2008/0057638 A1 | 3/2008 | Jang | |
| 2008/0242073 A1 | 10/2008 | Hong | |
| 2010/0244118 A1 | 9/2010 | Lee | |
| 2012/0211860 A1* | 8/2012 | Takekida | H10B 41/35 257/E21.546 |
| 2019/0341449 A1 | 11/2019 | Liu et al. | |

\* cited by examiner

*Primary Examiner* — Mohammad A Rahman
(74) *Attorney, Agent, or Firm* — Muncy, Geissler, Olds & Lowe, P.C.

(57) ABSTRACT

A semiconductor structure is provided. The semiconductor structure includes a substrate with a trench between active regions, a tunneling dielectric layer disposed on the substrate, a floating gate layer disposed on the tunneling dielectric layer, and an isolation feature disposed in the trench and on the substrate. The isolation feature has a first opening and a second opening below the first opening. The semiconductor structure further includes a mask disposed on the sidewall of the first opening, and a dielectric stack layer disposed directly above the mask and the second opening.

20 Claims, 3 Drawing Sheets

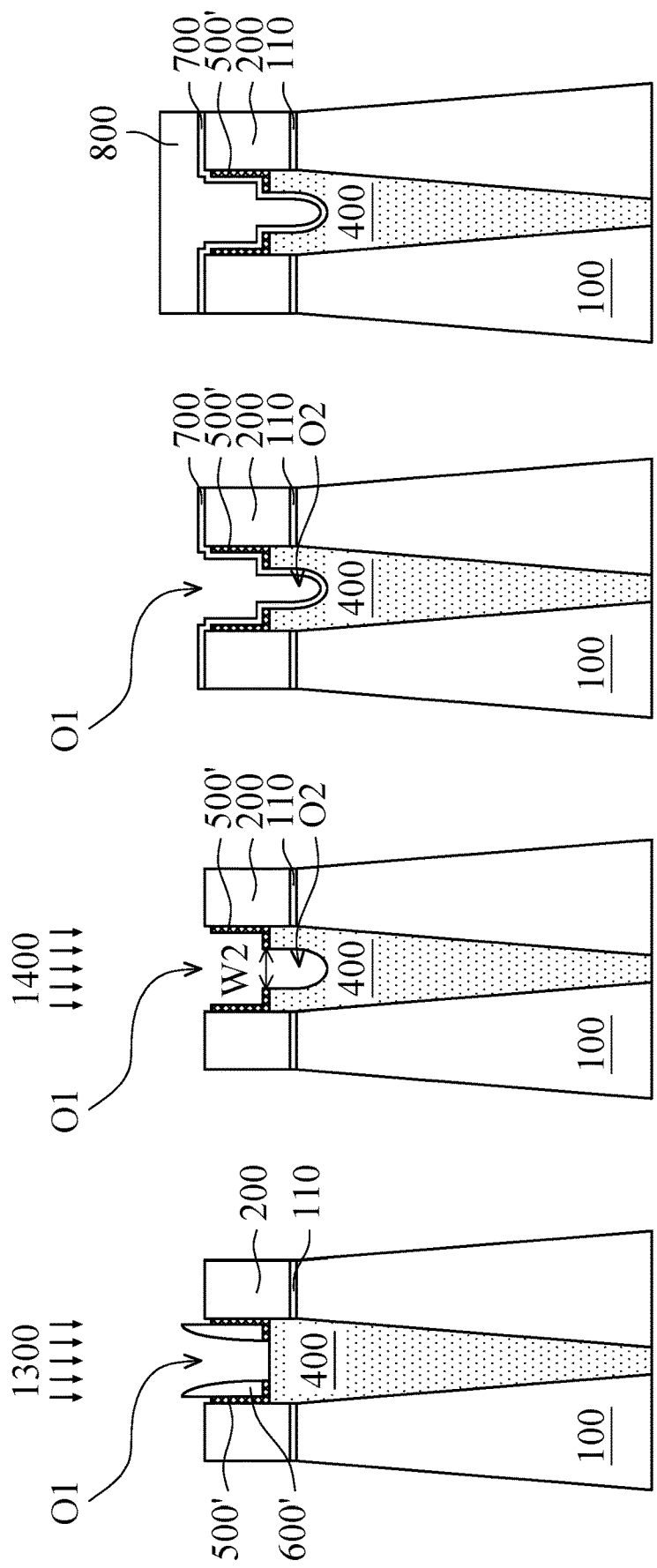

SEMICONDUCTOR STRUCTURE AND METHOD FOR FORMING THE SAME

BACKGROUND

Technical Field

The present disclosure relates in general to semiconductor structures, and in particular it relates to flash memory and methods for forming the same.

Description of the Related Art

As the dimensions of semiconductor devices continue to shrink, many challenges arise. For example, in flash memory, control over the recess of the device is important for device reliability. For example, when the opening between the floating gates is formed, the depth of the opening formed by the etching process is difficult to control due to the small dimensions after the scaling-down. This may lead to subsequent control gates being formed in different positions. Also, the etching process may cause a loss of the floating gate, which leads to a decrease in reliability and yield. Therefore, the industry still needs to improve the structure and method for forming a flash memory to overcome the problems caused by the scaling-down of the device.

BRIEF SUMMARY

In accordance with some embodiments of the present disclosure, a semiconductor structure is provided. The semiconductor structure includes a substrate that includes a trench between active regions, a tunneling dielectric layer disposed on the substrate, a floating gate layer disposed on the tunneling dielectric layer, and an isolation feature disposed in the trench and on the substrate. The isolation feature has a first opening and a second opening below the first opening. The semiconductor structure further includes a mask disposed on the sidewall of the first opening, and a dielectric stack layer disposed directly above the mask and the second opening.

In accordance with some embodiments of the present disclosure, a method for forming a semiconductor memory structure is provided. The method includes sequentially forming a tunneling dielectric layer, a floating gate layer, an oxide layer and a cap layer on a substrate. The method includes forming a trench in the substrate, the tunneling dielectric layer, the floating gate layer, the oxide layer, and the cap layer. The method includes forming an isolation feature in the trench. The method includes etching the isolation feature using the cap layer as an etching mask to form a first opening. The method includes forming masks on a sidewall of the first opening and on a portion of the bottom of the first opening. The method includes etching the isolation feature using the masks as etching masks to form a second opening. The method includes forming a dielectric stack layer directly above the masks and directly above the second opening.

BRIEF DESCRIPTION OF THE DRAWINGS

FIGS. 1-8 illustrate cross-sectional views of forming a semiconductor structure at different stages according to some embodiments of the present disclosure.

DETAILED DESCRIPTION

FIGS. 1-8 illustrate cross-sectional views of forming a semiconductor structure at different stages according to some embodiments of the present disclosure.

Figures 1, 2, 3, 4:
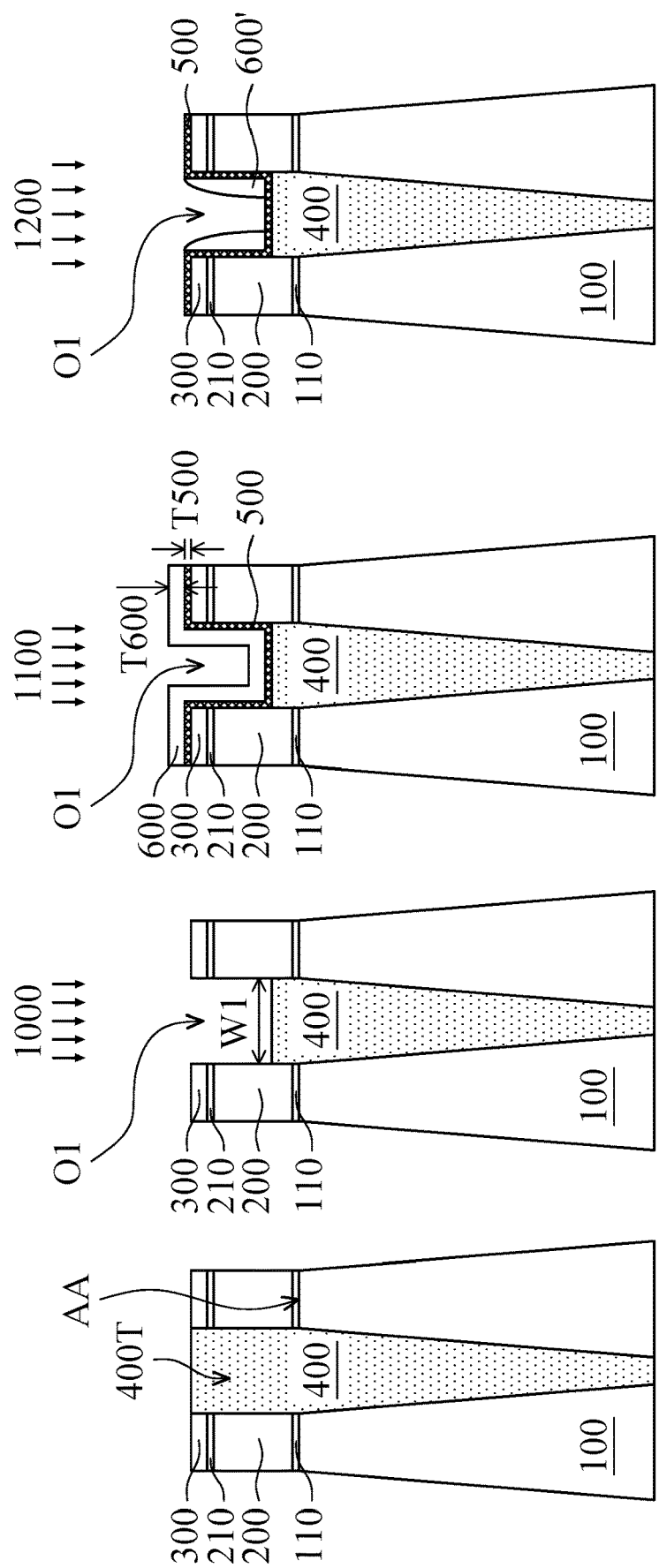

Referring to FIG. 1, a substrate 100 is provided. The substrate 100 may be an elemental semiconductor substrate, such as a silicon substrate, or a germanium substrate; or a compound semiconductor substrate, such as a silicon carbide substrate, a gallium arsenide substrate, a gallium phosphide substrate, an indium phosphide substrate, an indium arsenide substrate, and/or an antimony indium substrate; or alloy semiconductors, such as SiGe, GaAsP, AlInAs, AlGaAs, GaInAs, GaInP, GaInAsP, and/or combinations thereof. In some embodiments, the semiconductor substrate 100 may be a semiconductor-on-insulator substrate.

Continuing to refer to FIG. 1, a tunneling dielectric layer 110, a floating gate layer 200, an oxide layer 210, and a cap layer 300 are formed on the substrate 100.

The tunneling dielectric layer 110 may include oxide, nitride, oxynitride, or a combination thereof. In an embodiment, the tunneling dielectric layer 110 may be silicon oxide, silicon nitride, silicon oxynitride, high-k materials, or a combination thereof. The high dielectric constant material may be metal oxide, metal nitride, metal silicide, transition metal oxide, transition metal nitride, transition metal silicide, metal oxynitride, metal aluminate, zirconium silicate, zirconium aluminate. In an embodiment, the tunneling dielectric layer 110 may be formed by a deposition process or a thermal oxidation process. The aforementioned deposition process may include a chemical vapor deposition (CVD) process, a physical vapor deposition (PVD) process, an atomic layer deposition (ALD) process or other suitable processes.

The floating gate layer 200 may include a conductive material, such as doped or undoped polysilicon, amorphous silicon, metal, metal nitride, conductive metal oxide, or a combination thereof, and a method for forming the floating gate layer 200 may include, for example, CVD, PVD, ALD, sputtering, resistance heating evaporation, electron beam evaporation or other suitable processes.

The oxide layer 210 may include, for example, tetraethoxysilane (TEOS), and the formation method thereof may include, for example, CVD, PVD, ALD, or other suitable processes. The cap layer 300 may include nitride, such as silicon nitride, etc., and the formation method thereof may include, for example, CVD, PVD, ALD, or other suitable processes. The oxide layer 210 and the cap layer 300 may be used as protective layers to protect the floating gate layer 200 from being damage in the subsequent etching process.

Continuing to refer to FIG. 1, an isolation feature 400 is formed between the active regions AA of the substrate 100. Specifically, a trench 400T is formed in the substrate 100, in the tunneling dielectric layer 110, in the floating gate layer 200, in the oxide layer 210 and in the cap layer 300, and the isolation feature 400 is formed in the trench 400T. In an embodiment, the active region AA may be defined by the isolation feature 400. The isolation feature 400 may include a dielectric material, which may include silicon oxide, silicon nitride, silicon oxynitride, phosphosilicate glass, borophosphosilicate glass, fluorosilicate glass, undoped silicon glass, organic silicate glass, $SiO_xC_y$, spin-on glass, tetraethoxysilane, low-k dielectric materials, or combinations thereof.

In an embodiment, the cap layer 300, the floating gate layer 200, the tunneling dielectric layer 110, and the substrate 100 may be first etched using an anisotropic dry etching process to form the trench 400T. Then, the isolation feature 400 is formed by depositing isolation feature material by a deposition process similar to that described above. Then, excess isolation feature material is removed by a planarization process or an etching process. In an embodiment, the cap layer 300 and the isolation feature 400 may include nitride (such as silicon nitride) and oxide (such as spin-on-glass), respectively. In an embodiment, the top surface of the isolation feature 400 is level with the top surface of the cap layer 300. The aforementioned etching process may include, for example, a dry or wet etching process. The aforementioned planarization process may include chemical mechanical polishing.

Referring to FIG. 2, an upper portion of the isolation feature 400 is etched by an etching process 1000 to form an opening O1. In an embodiment, the bottom surface of the formed opening O1 is higher than the top surface of the tunnel dielectric layer 110. In an embodiment, the opening O1 has a width of W1. In an embodiment, the etching process 1000 includes an anisotropic dry etching process.

Next, referring to FIGS. 3-5, a mask 500' is formed on the sidewall of the opening O1 and a portion of the bottom of the opening O1.

Specifically, as shown in FIG. 3, the mask layer 500 and the sacrificial layer 600 are conformally formed by the deposition process 1100. That is, the mask layer 500 and the sacrificial layer 600 are formed sequentially along the top surface of the cap layer 300, the bottom surface and the sidewall of the opening O1. The mask layer 500 may include nitride, such as silicon nitride. The sacrificial layer 600 may include oxide, such as high temperature oxide or silicon oxide. In an embodiment, the mask layer 500 and the sacrificial layer 600 may be formed by CVD, PVD, ALD, or other suitable processes. In a specific embodiment, forming the sacrificial layer 600 by the ALD process may form a profile with a more uniform thickness at the corners while forming the sacrificial layer 600 by the CVD process may result in an excessive thickness at the corners.

As shown in FIG. 3, the mask layer 500 has a width of T500, and the sacrificial layer 600 has a width of T600. In an embodiment, the width of the subsequently formed second opening (FIG. 6) may be controlled by the width T600, and whether an air gap between adjacent active regions is set or not is further controlled (refer to FIGS. 8 and 10).

Next, as shown in FIG. 4, lateral portions of the sacrificial layer 600 are removed by an etching process 1200 to form sacrificial elements 600' on the sidewalls of the opening O1. Specifically, the sacrificial layer 600 on the top surface of the cap layer 300 and the top surface of the isolation feature 400 is removed to leave sacrificial elements 600' on the sidewalls of the opening O1. In an embodiment, the etching process 1200 includes an anisotropic dry etch process with etch selectivity.

Next, as shown in FIG. 5, the lateral portion of the mask layer 500 is removed by an etching process 1300 to form masks 500' on the sidewalls of the opening O1. Specifically, the mask layer 500 not covered by the sacrificial layer 600' (That is, the mask layer 500 on the cap layer 300 and the mask layer 500 on the isolation feature 400 and located between the sacrificial elements 600') is removed to leave masks 500' on the sidewalls of the opening O1. In an embodiment, the cap layer 300 and the oxide layer 210 are further removed by the etching process 1300. In an embodiment, the top surface of the mask 500' is not higher than the top surface of the floating gate layer 200 to ensure that the mask layer 500 between the sacrificial elements 600' may be cut off, thereby exposing the underlying isolation features 400. In an embodiment, the mask 500' has an L-shape, which not only serves as an etching mask for subsequently forming openings, but also protects the sidewalls of the floating gate layer 200 from being damage in the subsequent etching process.

In an embodiment, the etching process 1300 includes an isotropic wet etching process with etching selectivity, which etches the mask layer 500 and the cap layer 300 and the oxide layer 210 without substantially etching the floating gate layer 200. In another embodiment, the etching process 1300 includes an anisotropic dry etching process and an isotropic wet etching process with etching selectivity. Specifically, the mask layer 500 between the sacrificial elements 600' may be cut off by dry etching, and the mask layer 500 on the floating gate layer 200 may be removed. Then, the cap layer 300 may be removed by dry etching or wet etching, and then the oxide layer 210 may be removed by a dry etching process. Thereby, side etching may be prevented. It should be noted that the top surface of the mask 500 may be slightly lower than the top surface of the floating gate layer 200 due to the influence of wet etching. The wet etching process may include phosphoric acid ($H_3PO_4$) solution and the dry etching process may include halogenated hydrocarbon etchants (e.g., $CF_4$, $CHF_3$, $CH_2F_2$ and so on).

Next, as shown in FIG. 6, using the mask 500 as an etching mask, the isolation feature 400 is etched by an etching process 1400 to form the opening O2. In addition, in an embodiment, the sacrificial elements 600' may be removed during the etching of the isolation feature 400, or may be removed before or after the etching of the isolation feature 400. In some embodiments, the bottom surface of the opening O2 is lower than the bottom surface of the tunneling dielectric layer 110. In other word, as shown in FIG. 6, the bottom of the opening O2 extends downward between two adjacent active regions AA. In an embodiment, the width W2 of the opening O2 is smaller than the width W1 of the first opening O1 (W2<W1).

In an embodiment, the etching process 1400 includes an isotropic wet etching process with etching selectivity, such as buffered hydrofluoric acid, diluted hydrofluoric acid solution, and the like. Compared to the case of using the dry etching process, using the wet etching process may prevent the plasma from attacking the floating gate layer 200.

In an embodiment, since both the sacrificial element 600' and the isolation feature 400 include oxide and the mask 500' includes nitride, the etching process 1400 may be performed without substantially removing the mask 500', while the sacrificial element 600' and a portion of the isolation feature 400 are removed, thereby reducing the complexity of the process. In an embodiment, since the opening O1 is formed by a dry etching process and the opening O2 is formed by a wet etching process, in the normal direction of the substrate 100, the width W1 of the opening O1 does not substantially change toward the direction of the substrate 100, while the width of the opening O2 decreases toward the substrate 100. Furthermore, in an embodiment, the opening O1 is shown as a square shape (with corners), and the opening O2 is shown as an arc shape (or bowl shape).

Next, referring to FIG. 7, a dielectric stack layer 700 is conformally formed on the substrate 100. Specifically, the dielectric stack layer 700 covers the floating gate 200, the mask 500', and the isolation feature 400 exposed in the second opening O2. The dielectric stack layer 700 may include a single-layer structure or a multi-layer structure. For example, the dielectric stack layer 700 may be only silicon nitride or silicon oxide, or may also be an oxide-nitride-oxide structure or an oxide-nitride-oxide-nitride structure. In an embodiment, the method for forming the dielectric stack layer 700 may include, for example, CVD, PVD, ALD, or other suitable processes.

Next, referring to FIG. 8, a control gate layer 800 is blanketly formed on the dielectric stack layer 700. The control gate layer 800 may include conductive materials similar to those described above, such as polysilicon, and its formation method may include, for example, CVD, PVD, ALD, or other suitable processes.

Figure 10:
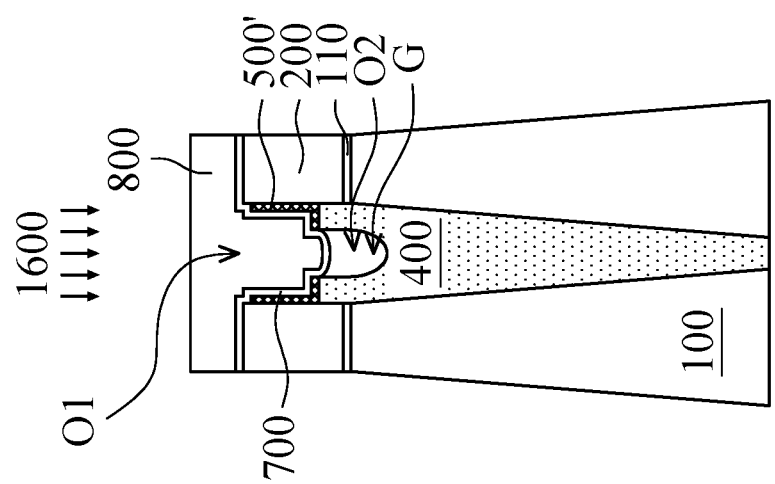
FIGS. 9-10 illustrate cross-sectional views of forming a semiconductor structure at different stages according to other embodiments of the present disclosure.
Figure 9:
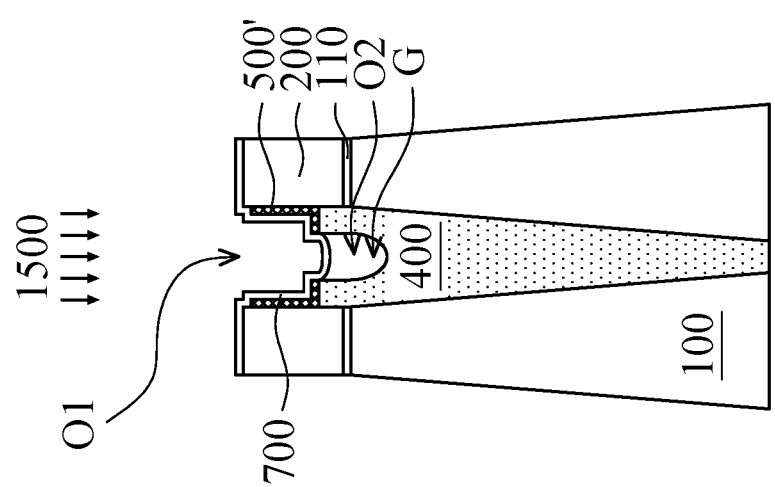

FIGS. 9-10 are cross-sectional views of forming a semiconductor structure at different stages according to other embodiments of the present invention.

Following FIG. 6, the structure of FIG. 9 is substantially similar to that of FIG. 7, the difference is that the dielectric stack layer 700 is suspended above the opening O2. That is, the dielectric stack layer 700 covers the floating gate 200 and the mask 500', but does not cover the isolation feature 400 exposed in the opening O2. Therefore, an air gap G exists in the opening O2, and the air gap G is interposed between the dielectric stack layer 700 and the isolation feature 400. In an embodiment, by setting the air gap G on the isolation feature 400 between two adjacent active regions AA, the interference of adjacent active regions may be further reduced. In an embodiment, due to stress, the dielectric stack layer 700 between the two masks 500' is shown as dish-shaped. That is, the two sides are higher than the middle.

Next, similar to the embodiment shown in FIG. 8, a control gate layer 800 is formed on the dielectric stack layer 700, and the semiconductor structure shown in FIG. 10 may be obtained.

In summary, compared to the single opening formed only by the dry etching process or only by the wet etching process in the prior art, by forming the oxide layer and the cap layer on the top of the floating gate layer, and forming masks on the sidewalls of the floating gate layer, and forming two openings in sections, the embodiments of the present invention may reduce the damage of the floating gate layer during the etching process. It may also have better control of the outline of the overall opening (two openings) and the uniformity of all openings to ensure the subsequent control of the position where the gate layer is formed and improve the reliability of the structure. Furthermore, according to the embodiment of the present invention, by forming the openings extending to the adjacent active regions, the dielectric stack layer may be further extended to the adjacent active regions, thereby reducing the operation interference between the adjacent active regions. In addition, an embodiment of the present invention may further reduce the operation interference of adjacent active regions and improve the reliability of the structure by setting an air gap at the opening.

What is claimed is:

1. A semiconductor structure, comprising:
    a substrate including a trench between active regions;
    a tunneling dielectric layer disposed on the substrate;
    a floating gate layer disposed on the tunneling dielectric layer;
    an isolation feature disposed in the trench and on the substrate, wherein the isolation feature has a first opening and a second opening below the first opening;
    a mask disposed on a sidewall and a bottom of the first opening; and
    a dielectric stack layer disposed directly above the mask and the second opening.

2. The semiconductor structure as claimed in claim 1, wherein a bottom surface of the second opening is lower than a bottom surface of the tunneling dielectric layer.

3. The semiconductor structure as claimed in claim 1, wherein a bottom surface of the first opening is higher than a top surface of the tunneling dielectric layer.

4. The semiconductor structure as claimed in claim 1, wherein the mask on the isolation feature is disposed discontinuously, while the dielectric stack layer on the isolation feature is disposed continuously.

5. The semiconductor structure as claimed in claim 1, wherein the mask extends along bottom of the first opening without extending to the second opening.

6. The semiconductor structure as claimed in claim 1, wherein a portion of a top surface of the mask is not higher than a top surface of the floating gate layer.

7. The semiconductor structure as claimed in claim 1, wherein a top surface of the dielectric stack layer is lower than a bottom surface of the mask.

8. The semiconductor structure as claimed in claim 1, wherein the second opening is spaced apart from the tunneling dielectric layer by the isolation feature.

9. The semiconductor structure as claimed in claim 1, wherein a width of the second opening is less than a width of the first opening.

10. The semiconductor structure as claimed in claim 1, wherein in a normal direction of the substrate, a width of the first opening is substantially unchanged toward the substrate, while a width of the second opening decreases toward the substrate.

11. The semiconductor structure as claimed in claim 1, wherein a gap is disposed in the second opening, wherein the gap is disposed between the isolation feature and the dielectric stack layer.

12. The semiconductor structure as claimed in claim 1, wherein the dielectric stack layer is suspended above the second opening.

13. The semiconductor structure as claimed in claim 1, wherein the dielectric stack layer is disposed on a side surface and a bottom surface of the first opening and on a side surface and a bottom surface of the second opening.

14. A method for forming a semiconductor structure, comprising:
    sequentially forming a tunneling dielectric layer, a floating gate layer, an oxide layer and a cap layer on a substrate;
    forming a trench in the substrate, in the tunneling dielectric layer, in the floating gate layer, in the oxide layer, and in the cap layer;
    forming an isolation feature in the trench;
    etching the isolation feature by using the cap layer as an etching mask to form a first opening;
    forming masks on a sidewall of the first opening and on a portion of a bottom of the first opening;
    etching the isolation feature by using the masks as etching masks to form a second opening; and
    forming a dielectric stack layer directly above the masks and directly above the second opening.

15. The method for forming a semiconductor structure as claimed in claim 14, wherein the step of forming the first opening comprises using a dry etching process, and wherein the step of forming the second opening comprises using a wet etching process.

16. The method for forming a semiconductor structure as claimed in claim 14, wherein the step of forming the masks comprises:
- sequentially forming a mask layer and a sacrificial layer along the sidewall and a bottom surface of the first opening;
- removing a lateral portion of the sacrificial layer and a lateral portion of the mask layer to form sacrificial elements and masks on the sidewall of the first opening;
- removing the sacrificial elements.

17. The method for forming a semiconductor structure as claimed in claim 16, wherein the step of removing the lateral portion of the sacrificial layer comprises etching the sacrificial layer using an anisotropic dry etching process.

18. The method for forming a semiconductor structure as claimed in claim 16, wherein the step of removing the lateral portion of the mask layer comprises: etching the mask layer, which is not covered by the sacrificial elements, using a wet etching process.

19. The method for forming a semiconductor structure as claimed in claim 14, wherein the step of forming the first opening comprises: exposing a sidewall of the floating gate layer without exposing a sidewall of the tunneling dielectric layer.

20. The method for forming a semiconductor structure as claimed in claim 14, wherein before forming the second opening, the method further comprises removing the cap layer and the oxide layer.

* * * * *